United States Patent
Veches

(10) Patent No.: US 9,659,668 B2
(45) Date of Patent: May 23, 2017

(54) VIA STACK FAULT DETECTION

(71) Applicant: Micron Technology, Inc., Boise, ID (US)

(72) Inventor: Anthony D Veches, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 14/291,589

(22) Filed: May 30, 2014

(65) Prior Publication Data

US 2015/0348647 A1    Dec. 3, 2015

(51) Int. Cl.
G11C 29/12    (2006.01)
G11C 29/50    (2006.01)
G11C 29/02    (2006.01)

(52) U.S. Cl.
CPC ...... *G11C 29/12005* (2013.01); *G11C 29/025* (2013.01); *G11C 2029/5006* (2013.01)

(58) Field of Classification Search
None
See application file for complete search history.

(56) References Cited

U.S. PATENT DOCUMENTS

| | | | | |
|---|---|---|---|---|
| 9,123,552 | B2* | 9/2015 | Keeth | H01L 23/481 710/305 |
| 2005/0023656 | A1* | 2/2005 | Leedy | B81B 7/02 257/678 |
| 2008/0315195 | A1* | 12/2008 | Yach | G01R 31/31717 257/48 |
| 2010/0078829 | A1* | 4/2010 | Hargan | G11C 5/02 257/777 |
| 2012/0060364 | A1* | 3/2012 | Hargan | H01L 25/0657 29/825 |
| 2012/0256653 | A1* | 10/2012 | Cordero | H03K 19/17796 326/16 |
| 2013/0275823 | A1* | 10/2013 | Cordero | H03K 19/17796 714/718 |
| 2014/0168879 | A1* | 6/2014 | Xie | H01L 27/0296 361/679.31 |
| 2014/0225624 | A1* | 8/2014 | Chakrabarty | G01R 31/318558 324/509 |
| 2015/0185273 | A1* | 7/2015 | DiRocco | H01L 22/14 324/762.03 |
| 2015/0192633 | A1* | 7/2015 | Garibay | G01R 31/318513 324/755.01 |
| 2015/0362534 | A1* | 12/2015 | DiRocco | H01L 22/14 324/76.11 |
| 2016/0043011 | A1* | 2/2016 | Xie | H01L 27/0296 257/48 |

* cited by examiner

*Primary Examiner* — Jermele M Hollington
*Assistant Examiner* — Suresh K Rajaputra
(74) *Attorney, Agent, or Firm* — Schwegman Lundberg & Woessner, P.A.

(57) ABSTRACT

A method and apparatus are disclosed. One such method includes selecting a die of a plurality of dies that are coupled together through a via stack. A via on the selected die can be coupled to ground. A supply voltage is coupled to an end of the via stack and a resulting current measured. A calculated resistance is compared to an expected resistance to determine if a fault exists in the via stack.

25 Claims, 4 Drawing Sheets

VIA STACK FAULT DETECTION

BACKGROUND

The memory industry is under constant pressure to reduce component size. One way that is being used to reduce component size is to fabricate memory devices as a three-dimensional (3D) memory device. This type of memory device can be achieved by forming a stack of memory cells vertically on a substrate, stacking a plurality of interconnected memory dies vertically within a single integrated circuit package, or some combination of these methods.

Multiple stacked memory dies in a memory package can be coupled (e.g., electrically connected) using vertical connectors, such as through-silicon vias (TSV) or other 3D conductive structures. Vias extend (at least partially) through a thickness of one or more of the dies and can be aligned when the dies are stacked, thus providing electrical communication among the dies in the stack. Such vias are often formed of a conductive material, such as aluminum or copper.

Once the integrated circuit dies are stacked and connected through the vias, it can be difficult to determine the location of a fault in the via stack. There are resulting needs for determining via stack faults.

DETAILED DESCRIPTION

A through-silicon via (TSV) is a vertical electrical connection passing at least partially through an integrated circuit wafer or die. These connections are referred to in the art as TSVs even though the die may comprise some material other than silicon (e.g., germanium). TSVs can be used to create three-dimensional (3D) packages of integrated circuits that can result in higher density integrated circuit packages with shorter, faster connections. The terms TSVs and vias can refer to any type of vertical connector that results in a connection between a plurality of dies.

The subsequent disclosure refers to a via stack. This can be defined as a respective via, from each die of a plurality of dies, being coupled together (e.g., die-to-die interconnect) in a series string of vias. The via stack can be either vertical, as shown in FIGS. 1 and 2, or horizontal.

Figure 1:
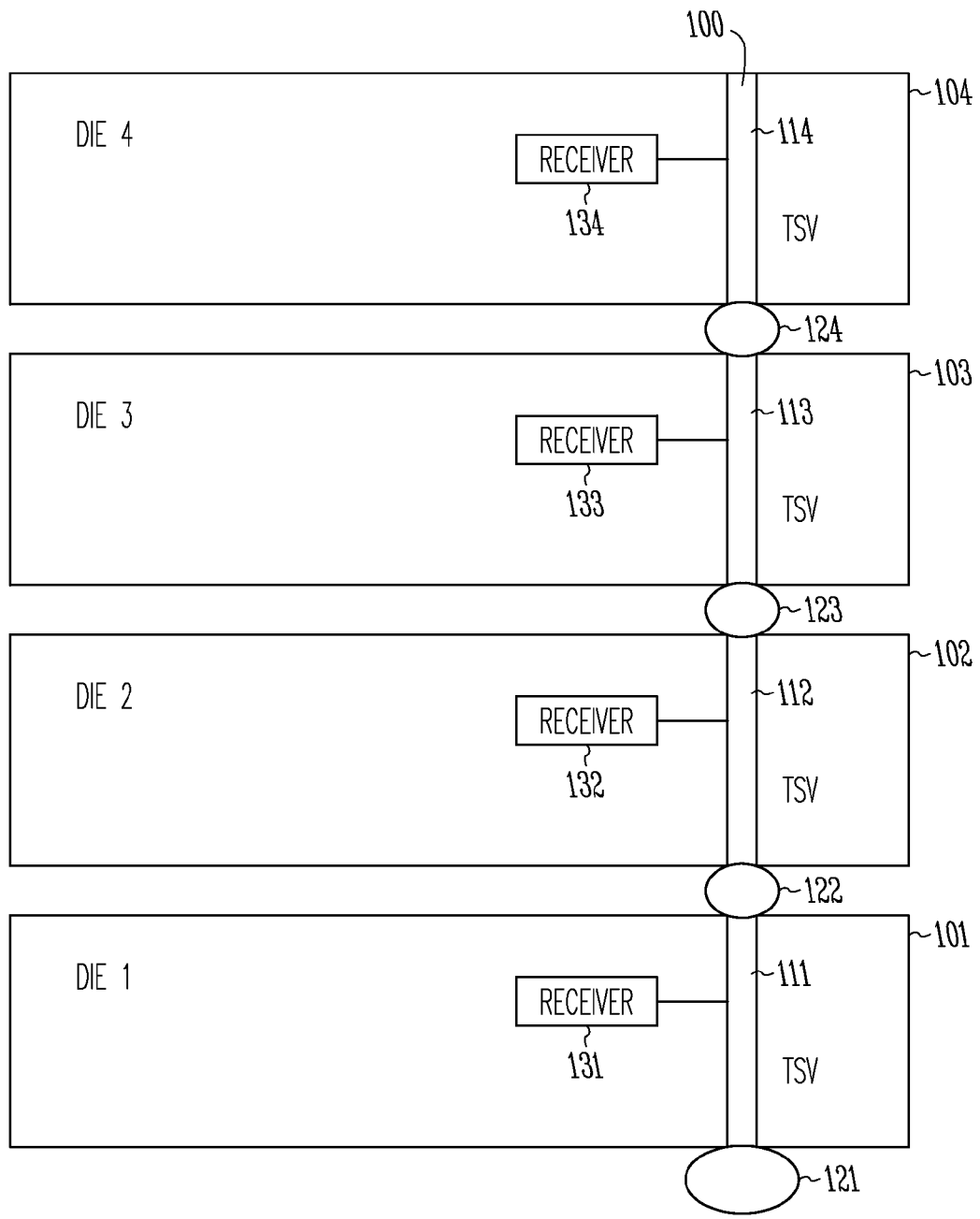
FIG. 1 illustrates a cross-sectional diagram of an embodiment of an integrated circuit die stack.
Figure 2:
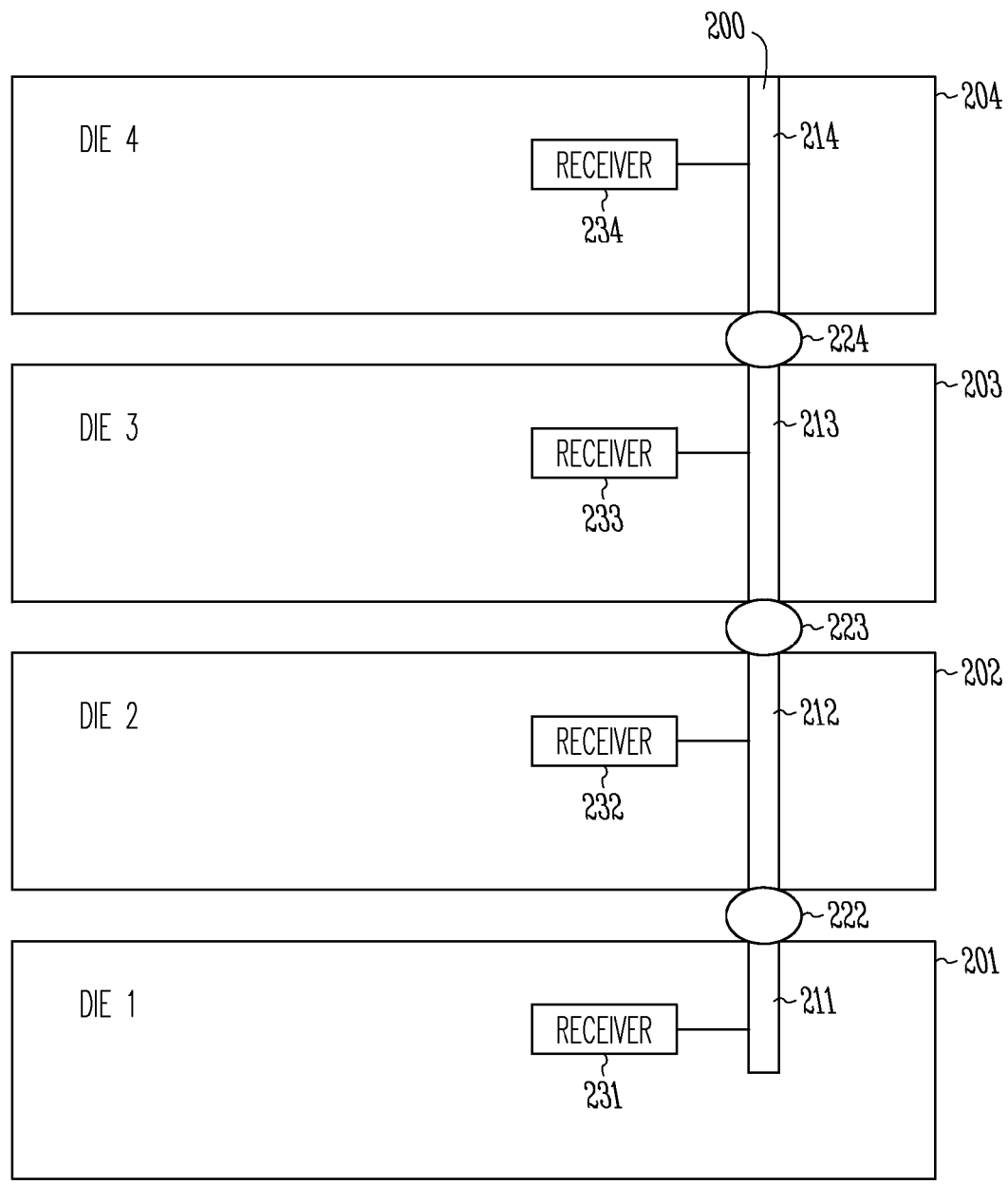
FIG. 2 illustrates a cross-sectional diagram of another embodiment of an integrated circuit die stack.

FIG. 1 illustrates a cross-sectional view of an apparatus including an integrated circuit die stack incorporating vias. This figure is for purposes of illustration only as the subsequently described embodiments do not require the use of solder bumps nor that the plurality of dies be stacked vertically. For example, the method of FIG. 3 can be used in detecting a fault in a connection between a plurality of horizontally coupled dies.

Once the plurality of dies has been connected through the vias, the individual vias of each die, as well as the connection itself, can become inaccessible. Thus, if the die connection process results in a via connection that is shorted to another connection, an open connection, or a connection that includes some foreign matter (e.g., an oxide) that reduces the conductivity of that connection, it can be difficult to access the individual connections to determine where the fault lies.

FIG. 1 shows a plurality of dies 101-104 (e.g., wafers) that are stacked vertically. A respective via 111-114 of each die 101-104 can be coupled to an adjacent die through a die-to-die interconnect 122-124 (e.g., solder bumps). An external connection 121 can be provided to access the via stack 100.

Each of the plurality of dies 101-104 can include one or more circuits. For example, one die 101 might include circuits for a memory controller while the other dies 102-104 can include memory circuits such as memory cells (e.g., DRAM, Flash). In such an embodiment, the via stack 100 can be used to connect the memory controller circuitry to the memory cells.

Each of the dies 101-104 can include a respective receiver circuit 131-134. The respective receiver circuit 131-134 is coupled to its respective via 111-114 for that particular die 101-104. The respective receiver circuit 131-134 for each die 101-104 can include receiver circuitry (e.g., buffers, amplifiers, logic) for coupling the die stack to the circuitry on the respective die 101-104. The respective receiver circuit 131-134 can also include circuitry to be used for identification, addressing, and control functions, of each die 101-104, as used in the subsequently described via stack fault detection method.

As described subsequently, the embodiment of FIG. 1 uses an external connection 121 (e.g., solder bump) to the via stack 100 in order to supply a voltage to the via stack 100 as well as measure a resulting current. However, as seen in FIG. 2, the via stack fault detection method can operate without this external connection 121.

Each of the receivers 131-134 of their respective dies 101-104 includes a selectable reference voltage circuit (e.g., circuit ground) as described subsequently with reference to FIG. 3. In operation, when a particular die/receiver is selected, its selectable reference voltage circuit can be enabled to be connect the die's respective via to circuit ground, thus grounding the via stack 100 up to that particular die in the stack. Any voltage now applied to the external connection 121 can cause a current to flow to ground through particular ones of the dies 101-104 up to the selected die. By measuring the resulting current, a resistance can be calculated and compared to an expected resistance. Any variation from the expected resistance can be used to detect a fault in the via stack 100. Operation of the selectable reference voltage circuit and the resulting via stack fault detection is described subsequently with reference to FIGS. 3 and 4.

FIG. 2 illustrates a cross-sectional diagram of another apparatus of an integrated circuit die stack incorporating vias but without an external connection to the via stack 200. This embodiment includes a plurality of dies 201-204, each with a respective via 211-214. The vias 211-214 are coupled to the respective via 211-214 of an adjacent die 201-214 through a die-to-die interconnect 222-224 (e.g., solder bump).

The embodiment of FIG. 2 includes a via 211 in DIE1 201 that does not have an external connection. Such a via 211 can connect various circuit levels within the die 201 that can be coupled to the adjacent die 202 and the remaining via stack 200 through the die-to-die interconnect 222.

As described subsequently, the embodiment of FIG. 2 uses an internal connection to the via stack 200 in order to supply the voltage to the via stack 200 as well as measure a resulting current. The internal connection can be supplied by circuitry in the receiver 231 of DIE1 201 that is coupled to the DIE1 via 211.

Each of the receivers 231-234 of their respective dies 201-204 includes a selectable reference voltage circuit (e.g., circuit ground) as described subsequently with reference to FIG. 3. In operation, when a particular die/receiver is selected, its reference voltage circuit can be enabled in order to couple the die's respective via to circuit ground. Another die, having a switchably coupled supply voltage from an internal connection, can apply a supply voltage to the via stack and cause a current to flow to ground through particular ones of the dies 201-204 up to the selected die. By measuring the resulting current, a resistance can be calculated and compared to an expected resistance. Any variation from the expected resistance can be used to detect a fault in the via stack 200. Operation of the selectable reference voltage circuit and the resulting via stack fault detection is described subsequently with reference to FIGS. 3 and 4.

Figure 4:
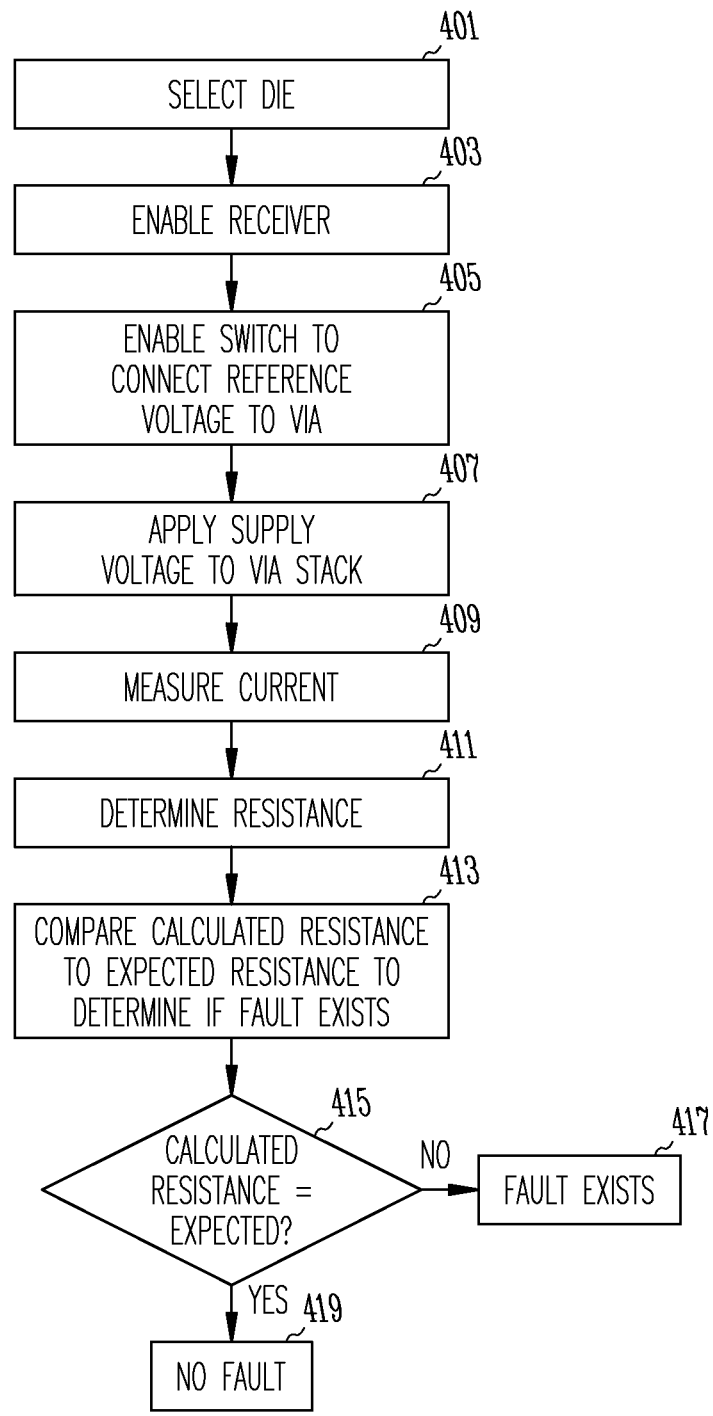
FIG. 4 illustrates a flowchart of an embodiment of a method for detecting a via stack fault in a plurality of dies coupled through vias.

Both of the embodiments of FIG. 1 and FIG. 2 can operate in substantially the same way, as described in the method illustrated in FIG. 4. The use of either an internal connection or an external connection to apply the supply voltage does not affect the method for applying the voltage to the via stack 100, 200, the detection of the via stack fault, or the resulting measurements.

Figure 3:
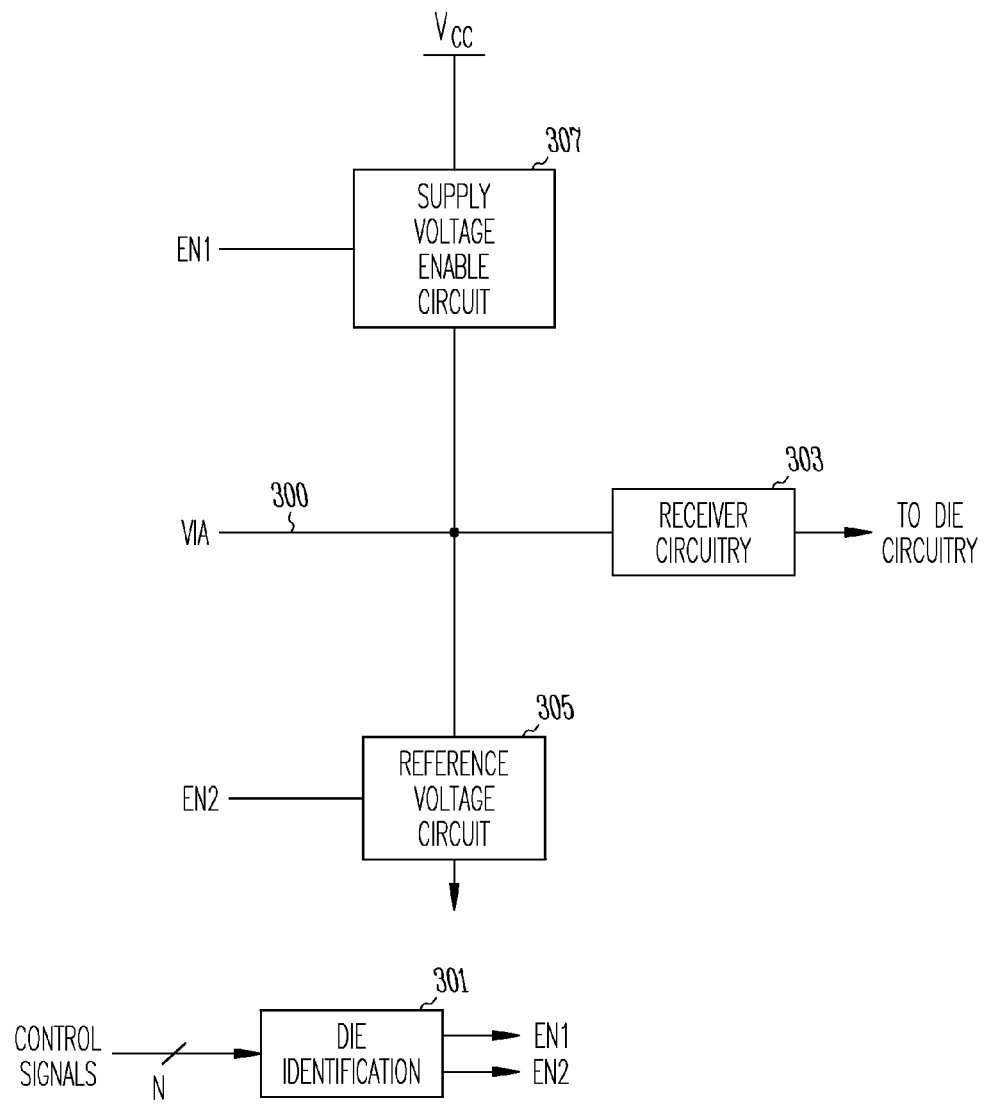
FIG. 3 illustrates a block diagram of an embodiment of a receiver circuit in accordance with the embodiments of FIGS. 1 and 2.

FIG. 3 illustrates a block diagram of an embodiment of the receiver 131-134 of FIG. 1 and the receiver 231-234 of FIG. 2. This figure is for purposes of illustration only since other circuits can provide the same receiver functionality as well as the same identification, addressing, and/or control functionality as the illustrated block diagram. For example, one or more of the receivers can use a direct chip select signal without an identification circuit 301. Thus, only an active chip select signal can select a respective die.

The various dies of the above embodiments can include memory circuitry and/or other circuits that can be substantially identical. For example, the receivers 131-134, 231-234 of each die can be substantially identical on two or more of the dies. Any memory circuits can have the same memory architecture including memory addressing and share common command, address, and/or data buses. These buses can be part of a via.

In order for an external controller circuit (not shown) to target a specific memory unit or other circuitry in the stacks of dies, an active chip select signal can be used. The active chip select signal can cause circuits on a specific die to process incoming commands, addresses, and/or data provided on common command, address, and/or data buses. Substantially simultaneously with the active chip select signal, the other dies are provided inactive chip select signals that cause those specific dies to ignore the incoming commands, addresses, and/or data.

Another embodiment can use an address decoder on each die in order to decode an incoming address. Each die can have a unique assigned address so that the circuitry on that particular die becomes active when the address for that particular die is received (e.g., valid address). The other dies, each having different respective addresses (e.g., invalid addresses), would have inactive circuitry.

Using the chip select scheme, the addressing scheme, or some other die selection scheme, the receiver 131-134, 231-234 on each die can be selected individually while the other receivers on the other dies will be inactive (i.e., deselected). Thus, the die identification circuit 301 can include a chip select receiving circuit, if the received control signal is a chip select signal, or an address decoder, if the received control signal is an address. The die identification circuit 301 can then generate one or more enable signals (e.g., EN1, EN2) that can be used by both the die circuitry (e.g., memory circuitry) and/or the respective die receiver blocks as described subsequently. The enable signals (e.g., EN1, EN2) are active when the particular respective die receiver is being accessed and inactive when the particular respective die receiver is not being accessed (e.g., another receiver is being accessed).

The receiver can further include receiver circuitry 303 that can be used to control and/or process any signals received from the via stack. For example, the receiver circuitry 303 can include buffers, amplifiers, and/or switches (e.g., transistors) for buffering, amplifying, and/or switching on/off, respectively, received signals from the via. The output of the receiver circuitry 303 is coupled to the die circuitry (e.g., memory cells, controller).

The receiver can further include a selectable reference voltage circuit 305 (e.g., selectable ground circuit) switchably coupled to its respective via 300. When enabled by an active control signal, EN2, the selectable reference voltage circuit can pull the via 300 to the reference voltage (e.g., ground). The selectable reference voltage circuit 305 can be a transistor whose control gate is coupled to the EN2 signal. In operation, an enable voltage on the control gate of the transistor can couple the via 300 to ground. Since the via 300 is part of the via stack 100, 200, the via stack 100, 200 up to the selected die is coupled to ground.

The receiver can further include a supply voltage enable circuit 307. The supply voltage enable circuit 307 can be used in the apparatus of FIG. 2 when no external connection is available to the stack of dies or it is not desirable to apply the supply voltage to an available external connection. Thus, the supply voltage enable circuit 307 can provide a supply voltage to the via 300 and, thus, to the via stack. The supply voltage enable circuit 307 can also include circuitry to determine a resulting current once a reference voltage enable circuit, of a selected receiver, has been selected to the reference voltage (e.g., ground). The supply voltage enable circuit 307 can include a transistor having a source coupled to the supply voltage $V_{CC}$, a drain coupled to the via 300, and a control gate coupled to the enable signal EN1. In operation, an active supply voltage enable signal, EN1, can be applied to the supply voltage enable circuit 307 to enable the transistor that couples the supply voltage $V_{CC}$ to the via 300. Since the via 300 is coupled to the via stack 100, 200, the via stack 100, 200 is coupled to the supply voltage.

The die selected to have its respective via coupled to ground is different than the die having its respective via coupled to the supply voltage. This would preclude the same die having its via coupled to both ground and the supply voltage simultaneously. In one embodiment, the lowest die in a stack of dies is the die to which the supply voltage can be coupled to its respective via.

The illustrated via 300 can include one of the vias of FIG. 1 or 2 111-114, 211-214. This via 300 is one via in the via stack 100, 200 of the illustrated embodiments.

FIG. 4 illustrates a flowchart of an embodiment of a method for via stack fault detection. The method includes selecting one of a plurality of dies 401. As previously described, selecting one of the plurality of dies can be accomplished with an active chip select signal while the unselected dies receive an inactive chip select signal. The selecting can also be accomplished by addressing the die. The selected die now forms one end of a subset of the plurality of dies (e.g., dies under test). The other end of the subset of the plurality of dies is the die comprising the connection to the supply voltage.

The respective receiver for the selected die can be enabled 403. Enabling the receiver may be accomplished with the same signal(s) for selecting the die or a separate, active receiver enable signal can be received by the receiver.

A signal is sent to the selected die to cause the reference voltage to be connected to the respective via of the selected die (e.g., short the via to ground) 405. The supply voltage is then applied to an end of the via stack 407 that is opposite the via stack end comprising the via shorted to ground. This can be accomplished through either the external connection or using an internal circuit to apply the supply voltage as described previously. In both cases, the supply voltage can be considered to be switchably coupled to the via stack.

The resulting current can be measured 409 and the resistance of the via stack, up to the selected die, can then be calculated 411. One skilled in the art knows that R=V/I.

The calculated resistance can then be compared to an expected resistance in order to determine if a fault exists in the via stack 413. The expected resistances can be determined by an estimation process of multiplying a resistance of one via by the number of vias in the via stack. The expected resistances can also be determined during the die fabrication process by measuring the different resistances of various quantities of stack dies. Other embodiments can determine the expected resistances in other ways.

If the calculated resistance approximately equals the expected resistance 415, there is no fault in the via stack 419. If the calculated resistance does not equal the expected resistance 415, a fault has been found in the via stack 417. For example, if the calculated resistance is infinite, an open connection exists in the via stack. If the calculated resistance is relatively low, a shorted connection exists in the via stack. The above process can be repeated using a subset of the tested dies in order to narrow down which die via or which die-to-die interconnect caused the fault.

In another embodiment, instead of calculating the resistance, the measured current can be used to determine if a fault exists in the via stack. For example, the measured current can be compared to a known good current. If the current is too low or non-existent, a fault may have been detected. For example, no current flow would be evidence of an open connection in the via stack. Low current flow would be evidence of a bad connection in the via stack. The expected measured current can be determined in substantially the same manner as the expected resistance.

As an example of operation, referring to the apparatus of FIG. 1 and method of FIG. 4, if DIE3 has been selected by an active chip select signal or an address, when the reference voltage circuit 305 of the receiver 133 is enabled, a path to ground now exists from the external connection 121 through DIE1 101, DIE2 102, and DIE3 103. DIE4 104, being above the selected DIE3 103, will not be coupled to ground. Thus, the current from the external connection 121 through DIE1 101, DIE2 102, and DIE3 103 will test the die-to-die interconnects 122, 123 and the vias 111-113 but not the die-to-die interconnect 124 between DIE3 103 and DIE4 104. A similar process can be used with an internal connection to supply voltage in DIE1.

If a resistance is calculated that does not approximately equal the expected resistance, the process can be repeated but DIE 2 102 can then be selected and the receiver 132 of that die 102 enabled such that the reference voltage circuit of that particular receiver couples the via 112 to ground. The supply voltage is applied and the current measured. If the resistance is still not what is expected, then the die-to-die interconnect 122 between DIE1 101 and DIE2 102 is defective or one of the first via 111 or the second via 112 is defective. If the resistance from the repeated process now approximately equals the expected resistance, it has been determined that the die-to-die interconnect 123 between DIE 2 102 and DIE3 103 is defective or the via 113 of DIE3 103 is defective.

As used herein, an apparatus may refer to, for example, circuitry, an integrated circuit die, a memory device, a memory array, or a system including such a circuit, die, device or array.

CONCLUSION

One or more embodiments of the method and apparatus for detecting a via stack fault can determine if a via stack includes shorted connection, an open connection, or a bad solder joint by measuring a resulting current from an applied supply voltage. Thus, even connections with no external access can be tested with the described embodiments.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. An apparatus for fault detection in a via stack, the apparatus comprising:
   a plurality of dies coupled together through the via stack, each die having a reference voltage selection circuit coupled to a respective via, each die further having a circuit configured to select its respective die and enable the reference voltage selection circuit to couple a reference voltage to the respective via; and
   a connection to the via stack configured to apply a supply voltage to the via stack and measure a resulting current through the via stack.

2. The apparatus of claim 1, wherein the reference voltage is circuit ground.

3. The apparatus of claim 1, wherein the via is a through-silicon via (TSV).

4. The apparatus of claim 1, wherein the circuit comprises a receiver configured to control coupling of the reference voltage to the respective via, the circuit including the reference voltage selection circuit and receiver circuitry coupled between the respective via and circuitry of the respective die.

5. The apparatus of claim 1, wherein the reference voltage selection circuit comprises a transistor that is configured to be turned on by an active enable signal to connect the respective via to ground.

6. The apparatus of claim 5, wherein only a subset of the plurality of dies is configured to include the resulting current in response to which die is selected, the subset including a quantity of dies that is less than the plurality of dies.

7. The apparatus of claim 6, wherein the subset of the plurality of dies includes one or more dies between a die that originates the supply voltage and the selected die.

8. The apparatus of claim 1, wherein the plurality of dies are stacked vertically.

9. An apparatus for via stack fault detection, the apparatus comprising:
   a plurality of dies;

a plurality of die-to-die interconnects, each die-to-die interconnect coupling a pair of adjacent dies of the plurality of dies;

a respective die via, on each of the plurality of dies, wherein the respective die via is switchably coupled to ground, each respective die via coupled to adjacent die vias through adjacent die-to-die interconnects to form the via stack;

a supply voltage connection switchably coupled to one end of the via stack and configured to apply a supply voltage to the via stack;

a connection to the via stack configured to measure a resulting current through the via stack.

10. The apparatus of claim 9, wherein the die via is switchably coupled to ground through a transistor in a die receiver.

11. The apparatus of claim 10, wherein the die receiver further comprises buffers, amplifiers, and logic between the respective die via and circuitry of a respective die.

12. The apparatus of claim 10, further comprising a die identification circuit configured to generate an enable signal for the transistor in response to an active chip select signal.

13. The apparatus of claim 10, further comprising a die identification circuit configured to generate an enable signal for the transistor in response to receiving a valid address.

14. The apparatus of claim 9, further comprising a circuit configured to enable a transistor to couple the respective die via to ground in response to an active chip select signal and an active transistor control gate signal.

15. The apparatus of claim 9, wherein the supply voltage connection is an external connection to the via stack.

16. The apparatus of claim 9, wherein the supply voltage connection is an internal connection to the via stack.

17. The apparatus of claim 16, wherein the internal connection comprises a receiver circuit having a supply voltage enable circuit that switchably couples the supply voltage to the via stack.

18. A method for fault detection of a via stack, the method comprising:

selecting a die of a plurality of dies;

coupling a via of the selected die to circuit ground to create one end of the via stack;

applying a supply voltage to an opposite end of the via stack; and measuring a resulting current on the via stack.

19. The method of claim 18, further comprising determining if a fault exists in the via stack in response to a comparison of the measured current to an expected current.

20. The method of claim 18, further comprising:

calculating a resistance of the via stack; and determining if a fault exists in the via stack in response to a comparison of the calculated resistance to an expected resistance.

21. The method of claim 20, further comprising detecting a fault in the via stack when the calculated resistance is not equal to the expected resistance.

22. The method of claim 21, further comprising:

detecting a short in the via stack when the calculated resistance is less than the expected resistance; and detecting an open connection when the calculated resistance is greater than the expected resistance.

23. The method of claim 18, wherein selecting the die of the plurality of dies comprises selecting a subset of the plurality of dies.

24. The method of claim 23, wherein selecting the subset of the plurality of dies comprises selecting the dies under test, and repeating the method for via stack fault detection after selecting a subset of the dies under test.

25. The method of claim 18, including selectively isolating circuitry of the selected die from the via of the selected die using receiver circuitry.

* * * * *